United States Patent [19]
Peng et al.

[11] Patent Number: 6,020,251
[45] Date of Patent: Feb. 1, 2000

[54] METHOD OF FORMING BURIED DIFFUSION JUNCTIONS IN CONJUNCTION WITH SHALLOW-TRENCH ISOLATION STRUCTURES IN A SEMICONDUCTOR DEVICE

[75] Inventors: Nai-Chen Peng; Ming-Tzong Yang, both of Hsinchu, Taiwan

[73] Assignee: United Silicon Incorporated, Hsinchu, Taiwan

[21] Appl. No.: 09/063,021

[22] Filed: Apr. 20, 1998

[30] Foreign Application Priority Data

Jan. 23, 1998 [TW]  Taiwan .................................. 87100942

[51] Int. Cl.[7] .......................... H01L 21/76; H01L 21/336
[52] U.S. Cl. .......................... 438/425; 438/296; 438/297; 438/526
[58] Field of Search ..................................... 438/425, 296, 438/297, 526

[56] References Cited

U.S. PATENT DOCUMENTS 5,763,309  6/1998  Chang ...................................... 438/262
5,946,577  8/1999  Tanaka ...................................... 438/297
5,960,284  9/1999  Lin et al. .................................. 438/259

Primary Examiner—John F. Niebling
Assistant Examiner—Alexander G. Ghyka
Attorney, Agent, or Firm—Christie, Parker & Hale, LLP

[57] ABSTRACT

A method is provided for use in a semiconductor fabrication process to form buried diffusion junctions in conjunction with shallow-trench isolation (STI) structures in a semiconductor device. This method features beak-like oxide layers formed to serve as a mask prior to the forming of the STI structures, which can prevent the subsequently formed buried diffusion junctions from being broken up during the process for forming the STI structures. Moreover, sidewall-spacer structures are formed on the sidewalls of a silicon nitride layer used as a mask in the ion-implantation process. This can prevent short-circuits between the buried diffusion junctions when the doped areas are annealed to be transformed into the desired buried diffusion junctions.

28 Claims, 5 Drawing Sheets

METHOD OF FORMING BURIED DIFFUSION JUNCTIONS IN CONJUNCTION WITH SHALLOW-TRENCH ISOLATION STRUCTURES IN A SEMICONDUCTOR DEVICE

CROSS-REFERENCE TO RELATED APPLICATION

This application claims the priority benefit of Taiwan application Ser. No. 87100942, filed Jan. 23, 1998, the full disclosure of which is incorporated herein by reference.

BACKGROUND OF THE INVENTION

1. Field of the Invention

This invention relates to semiconductor fabrication technologies, and more particularly, to a method of forming buried diffusion junctions (serving as source/drain regions) in conjunction with shallow-trench isolation (STI) structures in a semiconductor device. This method features the ability of buried diffusion junctions to be self-aligned and to serve as a plurality of parallel-spaced paired buried diffusion junctions with the STI structures formed therebetween and one of each pair of source/drain regions serving as a bit line.

2. Description of Related Art

MOS transistors (metal-oxide semiconductor transistor) are widely used as the basic switching elements in integrated circuits. A MOS transistor is typically composed of a gate, a source, and a drain. A semiconductor device usually consists of millions of MOS transistors; therefore isolation structures should be formed to electrically isolate the MOS transistors from each other. The isolation structures should be highly reliable in order to prevent possible short-circuits between the MOS transistors. A conventional method for forming isolation structures for MOS transistors is the so-called local oxidation of silicon (LOCOS) technique, which can be used to form thick field oxide layers on the substrate for isolating MOS transistors from each other. The LOCOS technique is able to provide highly reliable and effective isolation structures in the semiconductor device. However, it still has some drawbacks, such as stress and bird's beak problems. The bird's beak problem is particularly undesirable since it can cause the isolation structures to be less effective when the device is down sized for high integration. One solution to this problem is to use the so-called shallow-trench isolation (STI) structure in place of the LOCOS structure. The STI structure is not only effective in high-density devices, but is also highly solid and planarized.

In a semiconductor device with MOS transistors, bit lines are connected via contact holes to either the drain or the source of the MOS transistors so that data can be read out via the bit lines from the MOS transistors. In high-density devices, however, since the feature size is extremely small, the process for forming the contact holes is particularly difficult since it would be difficult to achieve precise alignment of the contact holes to the source/drain regions in the substrate. One solution to this problem is the so-called buried bit-line technique, which allows the bit lines to be formed in a buried manner that occupies only a small space in the substrate. One drawback to the buried bit-line structure, however, is that it does not allow the buried diffusion junctions and the STI structures to be formed on the same layout, due to the reason that the buried diffusion junctions will be broken up during the forming of the trenches used to form the STI structures. Moreover, by the conventional buried bit-line technique, the bit lines are formed after the bulk of the MOS transistors is finished, which would considerably increase the complexity of the fabrication process.

SUMMARY OF THE INVENTION

It is therefore an objective of the present invention to provide a method for forming buried diffusion junctions in conjunction with STI structures in a semiconductor device, which can prevent the buried diffusion junction from being broken up during the process for forming the STI structure.

It is another objective of the present invention to provide a method for forming buried diffusion junctions in conjunction with STI structures in a semiconductor device, by which the bit lines are not formed after the bulk of the MOS transistors is finished so as to simplify the overall fabrication process for the semiconductor device.

It is another objective of the present invention to provide a method for forming buried diffusion junctions after the high temperature steps of the STI structure, by which the lateral diffusion of the buried diffusion junction could be minimized. It can prevent short circuits between the buried diffusion junction.

In accordance with the foregoing and other objectives of the present invention, a method for forming buried diffusion junctions in conjunction with STI structures in a semiconductor device is provided. In accordance with the invention, two preferred embodiments are disclosed.

The method of the first preferred embodiment of the invention includes the following steps:

(1) preparing a semiconductor substrate, forming a first oxide layer over the substrate, forming a silicon nitride layer over the first oxide layer, and then removing a first selected part of the silicon nitride layer to expose those areas of the pad oxide layer beneath which the buried diffusion junctions are to be formed;

(2) performing an oxidation process so as to transform each of the said exposed portions of the pad oxide layer into a second oxide layer;

(3) removing a second selected part of the silicon nitride layer to expose part of the first oxide layer, with the remaining part of the silicon nitride layer covering the active regions;

(4) performing an etching process with the silicon nitride layer serving as mask to thereby etch away the exposed portions of the first oxide layer;

(5) forming a plurality of STI structures in the substrate to isolate the active regions from each other;

(6) forming a doped area in the substrate beneath each of the second oxide layers; and (7) performing an annealing process to transform the doped area into the desired buried diffusion junction.

The method of the second preferred embodiment of the invention includes the following steps:

(1) preparing a semiconductor substrate forming a first oxide layer over the substrate, forming a silicon nitride layer over the first oxide layer, and then removing a first selected part of the silicon nitride layer to expose those areas of the pad oxide layer beneath which the buried diffusion junctions are to be formed;

(2) performing an oxidation process so as to transform each of the exposed portions of the pad oxide layer that are uncovered by the silicon nitride layer into a second oxide layer;

(3) removing a second selected part of the silicon nitride layer to expose part of the first oxide layer, with the remaining part of the silicon nitride layer covering the active regions;

(4) performing an etching process with the silicon nitride layer serving as mask to etch away the exposed portions of the first oxide layer to form a trench;

(5) forming a doped area in the substrate beneath each of the second oxide layers;

(6) forming a plurality of STI structures in the substrate to isolate the active regions from each other; and (7) performing an annealing process to transform the doped area into the desired buried diffusion junction.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a method for forming a plurality of buried diffusion junctions in conjunction with a plurality of shallow-trench isolation (STI) structures in a semiconductor device. In accordance with the invention, a thick oxide layer is formed prior to the forming of the STI structures to serve as an etching mask, which can prevent the subsequently formed buried diffusion junctions to be broken up during the process for forming the STI structures. The buried diffusion junctions are to be used as a plurality of paired source/drain regions, with one of each pair of source/drain regions serving as a bit line.

Figure 1:
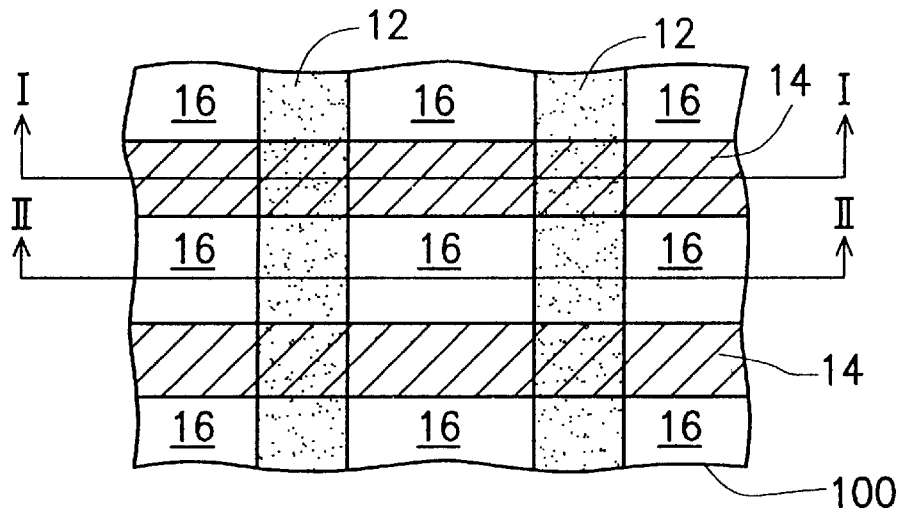
FIG. 1 is a schematic top view showing the layout of part of a semiconductor device which is provided with buried diffusion junctions in conjunction with STI structures.

FIG. 1 is a schematic top view showing the layout of a semiconductor device which is provided with a plurality of buried diffusion junctions and a plurality of associated STI structures (shown here is a simplified diagram, actual layout can be very complex). As shown, the semiconductor device includes a semiconductor substrate 100 which is partitioned into a plurality of parallel-spaced source/drain regions 12 (one of each pair of source/drain regions is used to serve as a bit line) and active regions 14. Further, a plurality of shallow-trench isolation (STI) regions 16 are formed between the active regions 14 so as to isolate the active regions 14 from each other. In FIG. 1, the lines I—I indicates a cross section where the active regions 14 of the device are formed, while the line II—II indicates another cross section where the STI regions 16 are formed.

Two preferred embodiments of the method of the invention for forming the buried diffusion junctions and the STI structures in the semiconductor device of FIG. 1 will be disclosed in the following with reference respectively to FIGS. 2A–2G and to FIGS. 3A–3F. First Preferred Embodiment FIGS. 2A–2G are schematic sectional diagrams used to depict the steps involved in the first preferred embodiment of the method according to the invention for forming a plurality of buried diffusion junctions in conjunction with a plurality of associated STI structures in a semiconductor device.

Figure 2A:
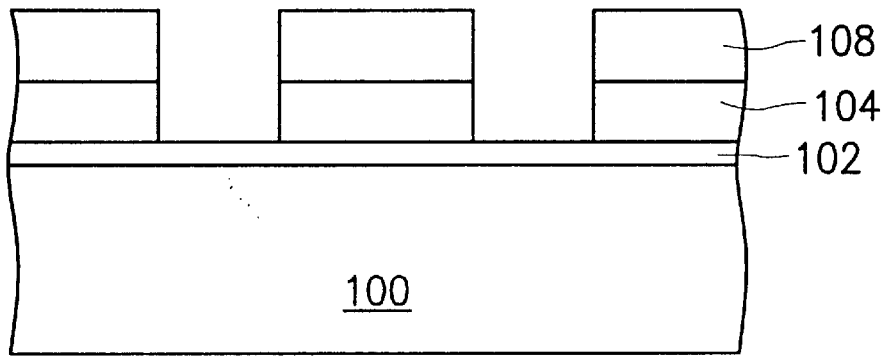
FIGS. 2A–2G are schematic sectional diagrams used to depict the steps involved in a first preferred embodiment of the method according to the invention for forming buried diffusion junctions in conjunction with STI structures in a semiconductor device.

Referring first to FIG. 2A, in the first step, a semiconductor substrate 100 is prepared, then a pad oxide layer 102 is formed over the entire top surface of the substrate 100 through a thermal oxidation process. Subsequently, a layer of silicon nitride 104 is formed over the pad oxide layer 102 through a chemical-vapor deposition (CVD) process; and after this, a photoresist layer 108 is coated over the entire top surface of the silicon nitride layer 104. The silicon nitride layer 104 is then selectively removed through a photolithographic and etching process using the photoresist layer 108 as mask. This exposes those regions of the pad oxide layer 102 laid directly above those regions in the substrate 100 where the buried diffusion junctions are to be formed. At this stage, since the active regions of the device are not yet defined and formed, the I—I and II—II cross sections in FIG. 1 are the same as shown in FIG. 2A.

Figure 2B:
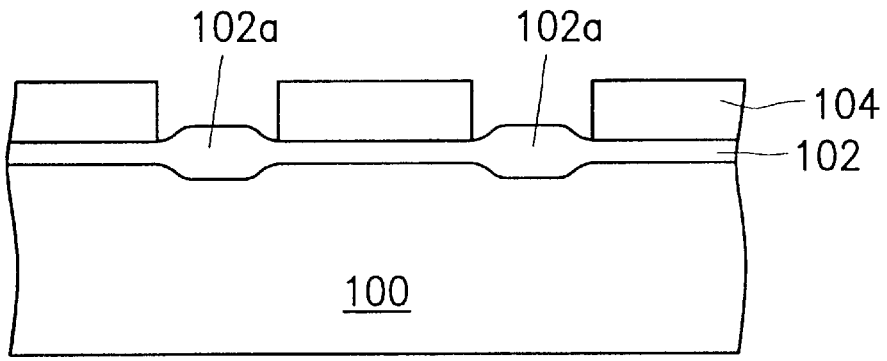

FIG. 2B shows the subsequent step in which the entire photoresist layer 108 is removed. Next, a wet-oxidation process is performed in a humid environment so as to further oxidize the exposed portions of the pad oxide layer 102 (as indicated by the reference numeral 102a in FIG. 2B). As a result of this process, the exposed portions 102a of the pad oxide layer 102 are each thickened into a beak-like shape (hereinafter referred to as beak-like oxide layer) to a thickness of about 600 Å–1,000 Å.

Figure 2C:
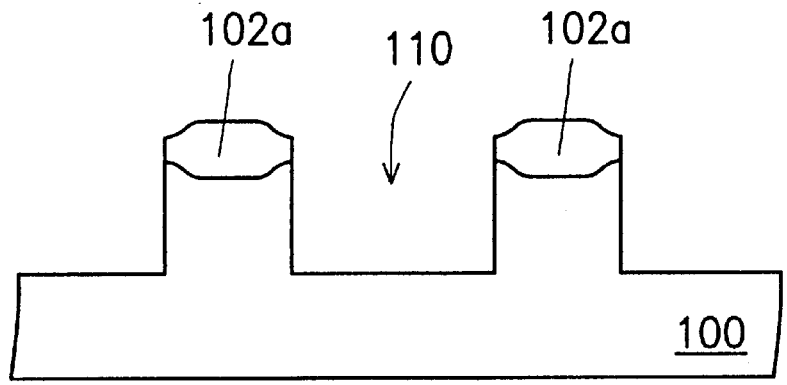

Referring next to FIG. 2C (which shows the II—II cross section in FIG. 1), a photolithographic and etching process is then performed on the wafer so as to define and form a plurality of active regions (i.e., those regions indicated by the reference numeral 14 in FIG. 1) and a plurality of areas where the shallow-trench isolation (STI) structures are to be formed. In this process, those regions that are covered by the masking photoresist layer (not shown) are defined as the active regions, while those uncovered are defined as the areas where the STI structures are to be formed. Subsequently, a dry-etching process is performed on the wafer using a suitable etchants that can etch into the exposed silicon nitride layer 104 until the underlying surface of the pad oxide layer 102 is exposed. After this, the wafer is submerged in a solution of hydrofluoric acid (HF) so as to remove all the pad oxide layer 102 other than the thick beak-like oxide layers 102a until the top surface of the substrate 100 is exposed. An etching process is then performed on the wafer with the thick beak-like oxide layers 102a serving as a mask, whereby each exposed portion of the substrate 100 between the beak-like oxide layers 102a is etched away to form a trench 110 in the substrate 100. In this etching process, the use of the beak-like oxide layers 102a as the mask prevents the subsequently formed buried diffusion junctions (to be detailed later) from being broken up during the process for forming the STI structure.

Figure 2D:
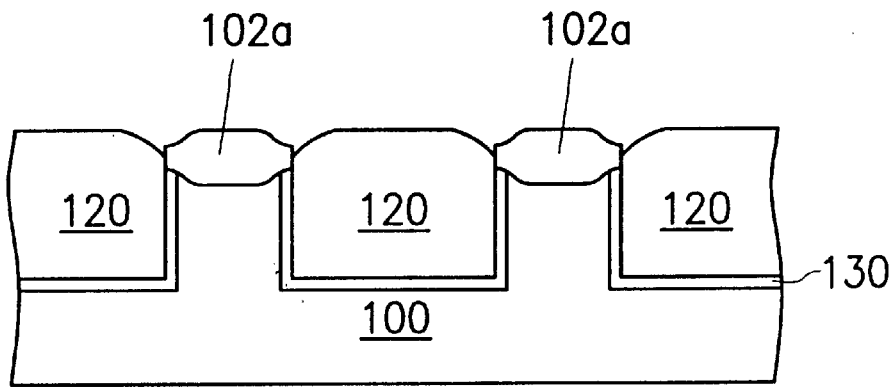

Referring further to FIG. 2D (which shows the II—II cross section in FIG. 1), the next step is to perform a conventional process for forming an STI structure in each trench 110. The first step is to form a liner oxide layer 130 on the bottom and sidewalls of each trench 110 (FIG. 2C). After this, an annealing process is performed on the wafer so as to allow any portions of the wafer damaged due to etching in the earlier process to be restored to original form.

Subsequently, a dielectric material, such as tetra-ethyl-ortho-silicate (TEOS), is used to fill up each trench 110 (FIG. 2C) in the substrate 100 through an atmosphericpressure chemical-vapor deposition (CVD) process to an overflow level above the top surface of the beak-like oxide layers 102a. Next, a densification process at a temperature of about 1,000° C. is performed to solidify the TEOS layer. After this, a chemical-mechanical polish (CMP) process is performed on the wafer so as to polish away all the portions of the TEOS layer that stick up above the surface of the beak-like oxide layers 102a due to overflow. Through this process, the remaining portions of the TEOS layer 120 in each trench 110 (FIG. 2C) are used to serve as oxide plugs. Next, a solution of $H_3PO_4$ is used to etch away the silicon nitride layer 104 in these areas until the surfaces of the underlying portions of the pad oxide layer 102 are exposed.

Figure 2E:
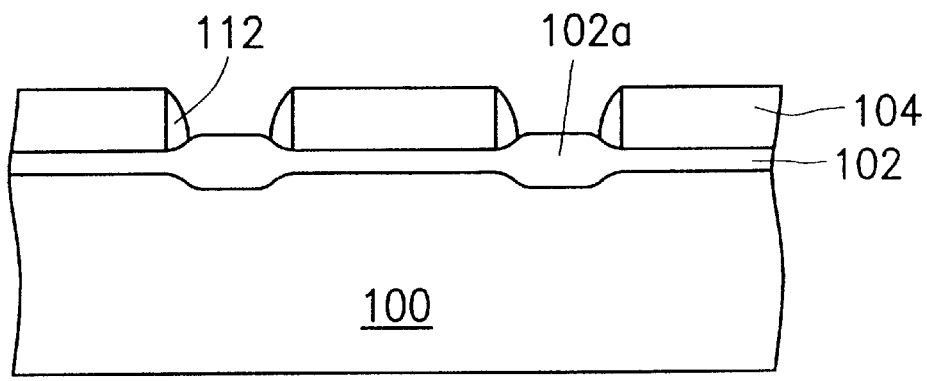

Referring next to FIG. 2E (which shows the I—I cross section in FIG. 1), in the subsequent step, a plurality of sidewall spacers 112 are formed on the sidewalls of the openings in the silicon nitride layer 104. These sidewall spacers 112 are formed by first depositing an oxide layer over the entire top surface of the wafer to a thickness of about 1,000 Å–2,000 Å through a CVD process, and then performing an anisotropic etching process on the oxide layer. Through the anisotropic etching process, the remaining portions of the oxide layer then serve as the sidewall spacers 112.

Figure 2F:
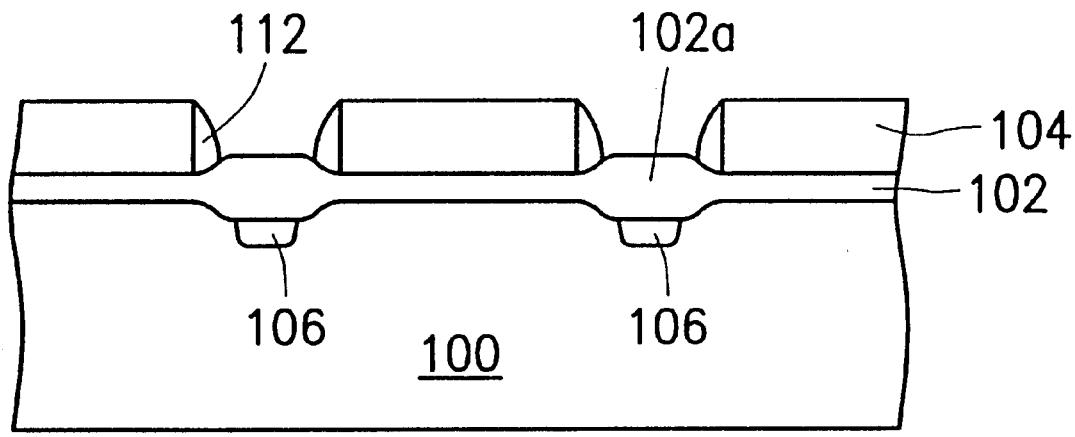
Figure 2G:
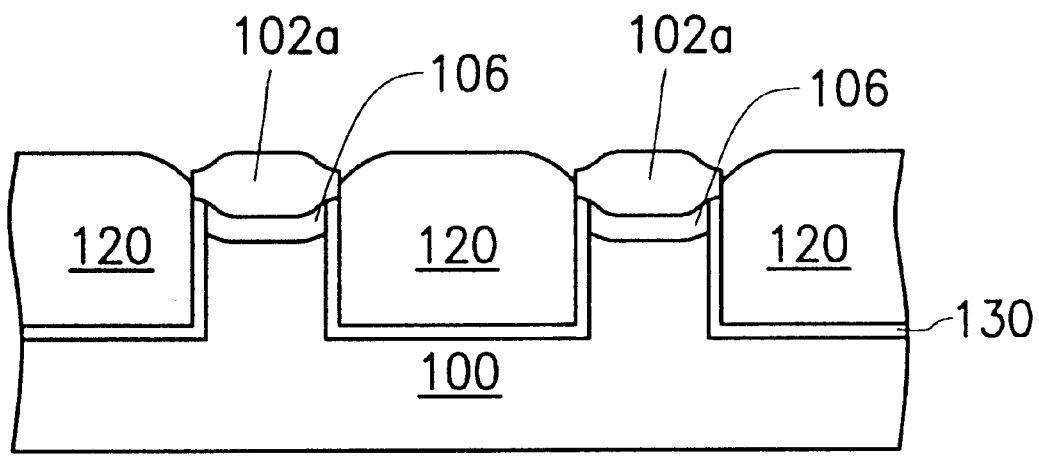

Referring to FIG. 2F (which shows the I—I cross section in FIG. 1) together with FIG. 2G (which shows the II—II cross section in FIG. 1), in the subsequent step, an ion-implantation process is performed on the wafer so as to dope an impurity element, such as arsenic (As), in ionic form into those areas in the substrate 100 that are located directly beneath the beak-like oxide layers 102a. During this process, the beak-like oxide layers 102a can serve to suppress the so-called channeling effect such that a suitable implant depth can be achieved, with the silicon nitride layer 104 and the sidewall spacers 112 serving as implant stoppers. After this, an annealing process is performed on the wafer, whereby the doped regions beneath the beak-like oxide layers 102a are transformed into the desired buried diffusion junctions 106 which serve as the source/drain regions in the device.

Due to the provision of the sidewall spacers 112, the neighboring buried diffusion junctions 106 can be formed with a greater separating distance, allowing the impurity ions in the doped regions not to be overly diffused into the neighboring buried diffusion junctions during the annealing process. When the device is further down sized for higher integration, this benefit can ensure that the neighboring buried diffusion junctions 106 in the device are not short-circuited due to the very small separating distance between them. Those buried diffusion junctions 106 serve as a plurality of paired source/drain regions, with one of each pair of source/drain regions serving as a bit line.

The solution of $H_3PO_4$ is used to etch away the remaining silicon nitride layer 104. After this, an oxide layer is formed through a CVD process; and then a second CMP process is performed to remove the sidewall spacers 112. All of the subsequent steps to complete the fabrication of the semiconductor device are conventional techniques, so detailed description thereof will not be given.

It can be learned from the foregoing description that the method of the invention can prevent the buried diffusion junctions from being broken up during the subsequent process for forming the STI structures. This is due to the fact that a thick oxide layer, i.e., the beak-like oxide layer 102a, is formed prior to the forming of the STI structures, and serves as a mask to protect against etching. Moreover, due to the provision of the sidewall spacers 112 on the sidewalls of the openings formed in the silicon nitride layer 104, the neighboring buried diffusion junctions can be separated by a greater distance, thus allowing the impurity ions in the doped regions not to be overly diffused into the neighboring buried diffusion junctions during the annealing process. When the device is further down sized for higher integration, this benefit can ensure that the neighboring buried diffusion junctions in the device are not be shorted due to the very small separation between them. The buried diffusion junctions formed by the method of the invention serve as a plurality of paired source/drain regions, with one of each pair of source/drain regions serving as a bit line. Second Preferred Embodiment FIGS. 3A–3F are schematic sectional diagrams used to depict the steps involved in the second preferred embodiment of the method according to the invention for forming a plurality of buried diffusion junctions in conjunction with a plurality of associated STI structures in a semiconductor device.

Figure 3A:
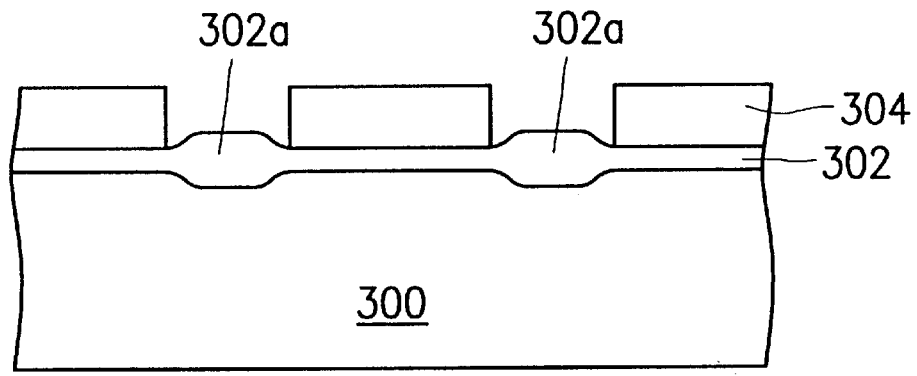
FIGS. 3A–3F are schematic sectional diagrams used to depict the steps involved in a second preferred embodiment of the method according to the invention for forming buried diffusion junctions in conjunction with STI structures in a semiconductor device.

Referring first to FIG. 3A, in the first step, a semiconductor substrate 300 is prepared; then a pad oxide layer 302 is formed over the substrate 300 through a thermal oxidation process. After this, a layer of silicon nitride 304 is formed over the pad oxide layer 302 through a chemical-vapor deposition (CVD) process; and then a photolithographic and etching process is performed so as to remove selected portions of the silicon nitride layer 304 to expose those regions of the pad oxide layer 302 that are laid directly above those regions in the substrate 300 where the buried diffusion junctions are to be formed.

Subsequently, a wet oxidation process is performed in a humid environment so as to further oxidize the exposed portions of the pad oxide layer 302 (as indicated by the reference numeral 302a in FIG. 3A). As a result of this process, the exposed portions 302a are each thickened into a beak-like portion (hereinafter referred to as beak-like oxide layer) to a thickness of about 600 Å to 1,000 Å. At this stage, since the active regions of the device are not yet defined and formed, the two cross sections cutting respectively through the lines I—I and II—II in FIG. 1 are the same as shown in FIG. 3A.

Figure 3B:
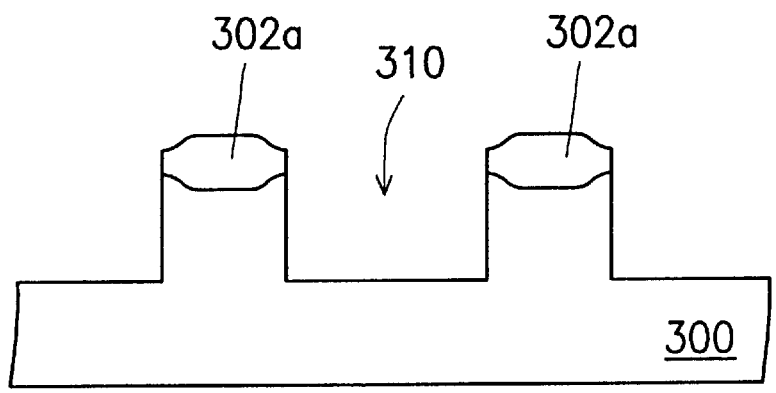

Referring next to FIG. 3B (which shows the II—II cross section in FIG. 1), a photolithographic and etching process is then performed on the wafer so as to define and form a plurality of active regions (i.e., those regions indicated by the reference numeral 14 in FIG. 1) and a plurality of areas where the shallow-trench isolation (STI) structures are to be formed. In this process, those regions that are covered by the masking photoresist layer (not shown) are defined as the active regions, while those uncovered are defined as the areas where the STI structures are to be formed. Subsequently, a dry-etching process is performed on the wafer to remove the exposed portions of the silicon nitride layer 304. Then, the wafer is submerged in a solution of hydrofluoric acid (HF) until the top surface of the substrate 300 is exposed. Therefore, the pad oxide layer 302 uncovered by the masking photoresist layer is removed but the thick beak-like oxide layers 302a is remained. Subsequently, an etching process is performed on the wafer with both the masking photoresist layer and the thick beak-like oxide layers 302a serving as masks, whereby each exposed portion of the substrate 300 between the beak-like oxide layers 302a is etched away to form a trench 310 in the substrate 300. In this etching process, the use of the beak-like oxide layers 302a as the mask allows the subsequently formed buried diffusion junctions (to be detailed later) to be formed without breaks. The details thereof have been described in the previous section of the first preferred embodiment, will detailed description thereof will not be herein repeated.

Figure 3C:
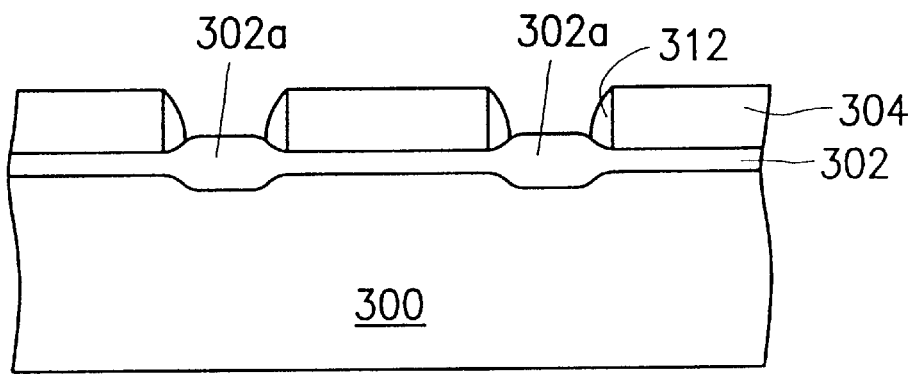
Figure 3D:
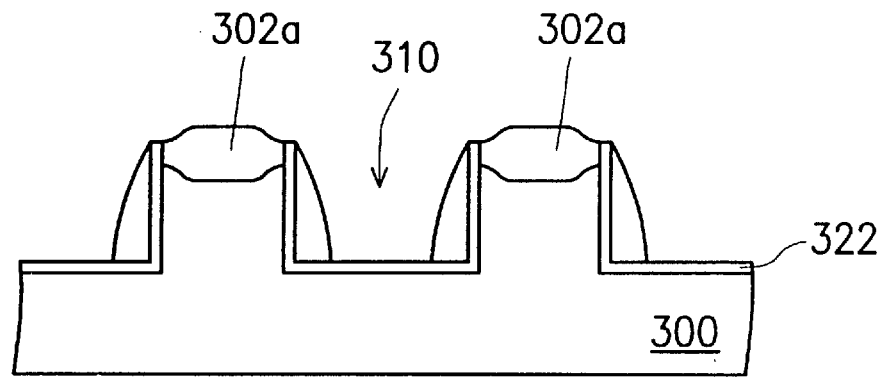

Referring to FIG. 3C (which shows the I—I cross section in FIG. 1) together with FIG. 3D (which shows the II—II cross section in FIG. 1), in the subsequent step a liner oxide layer 322 is formed over the bottom and sidewalls of each trench 310 in the substrate 300. After this, an annealing process is performed on the wafer so as to allow any portions of the wafer damaged due to etching in the earlier process to be restored to original form. Subsequently, a first sidewall-spacer structure 312 (FIG. 3C) is formed on the sidewalls of the openings in the silicon nitride layer 304, while a second sidewall-spacer structure 332 (FIG. 3D) is formed on the sidewalls of each trench 310 in the substrate 300. These two sidewall-spacer structures 312, 332 are formed together by first depositing an oxide layer over the entire top surface of the wafer to a thickness of about 1,000 Å to 2,000 Å through a CVD process, and then performing an anisotropic etching process on the oxide layer. The provision of the first sidewall-spacer structure 312 has the benefit of causing the neighboring buried diffusion junctions 306 to be formed with a greater separating distance, thus allowing the impurity ions in the doped regions to not be overly diffused into the neighboring buried diffusion junctions during the annealing process. The provision of the second sidewall-spacer structure 332 can prevent the sidewalls of the trench 310 from being penetrated by impurity ions during the subsequent ion-implantation process for forming the buried diffusion junctions.

Figure 3E:
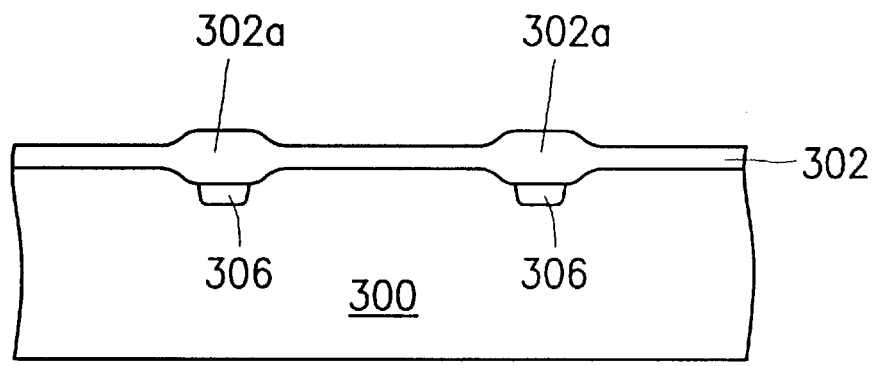
Figure 3F:
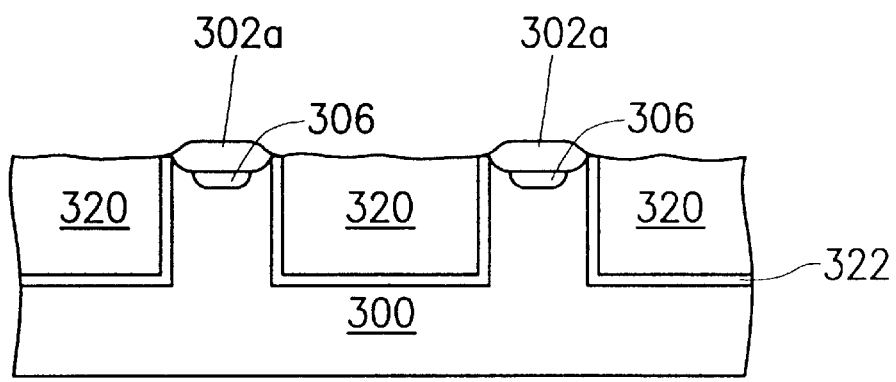

Referring further to FIG. 3E (which shows the I—I cross section in FIG. 1) together with FIG. 3F (which shows the II—II cross section in FIG. 1), an ion-implantation process is then performed on the wafer to dope an impurity element, such as arsenic (As), in ionic form into those areas in the substrate 300 that are located beneath the beak-like oxide layers 302a. During this process, the beak-like oxide layers 302a can serve to suppress the so-called channeling effect such that a suitable implant depth can be achieved, with the silicon nitride layer 304 and the sidewall spacers 312 serving as implant stoppers. After this, the wafer is submerged in a solution of HF so as to remove both the first and second sidewall-spacer structures 312, 332. Then, a conventional process is performed to form the STI structures, whose procedural steps have been described in the section of the first preferred embodiment. A detailed description thereof will not be herein repeated. In the process for forming the STI structures, however, the high-temperature condition in the densification step also causes the annealing of the doped regions into the desired buried diffusion junctions 306 beneath the beak-like oxide layers 302a. These buried diffusion junctions 306 serves as a plurality of paired source/drain regions for the device, with one of each pair of source/drain regions serving as a bit line.

It can be learned from the foregoing description that the method of the invention can prevent the buried diffusion junctions from being broken up during the subsequent process for forming the STI structures. This is due to the fact that a thick oxide layer, i.e., the beak-like oxide layer 302a, is formed prior to the forming of the STI structures, which serves as a mask to protect against etching. Moreover, due to the provision of the sidewall spacers 312 on the sidewalls of the openings formed in the silicon nitride layer 304, the neighboring buried diffusion junctions can be separated by a greater distance, thus allowing the impurity ions in the doped regions to not be overly diffused into the neighboring buried diffusion junctions during the annealing process. When the device is further down sized for higher integration, this benefit can assure that the neighboring buried diffusion junctions in the device are not be shorted due to the very small separation between them. Further, the provision of the second sidewall-spacer structure 332 can prevent the sidewalls of the trench 310 from being penetrated by impurity ions in the subsequent ion-implantation process for forming the buried diffusion junctions.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a plurality of buried diffusion junction in a semiconductor device, comprising the steps of:
   (1) preparing a semiconductor substrate, forming a first oxide layer over the substrate, forming a silicon nitride layer over the first oxide layer, and then removing a first selected part of the silicon nitride layer to thereby expose those areas of the pad oxide layer beneath which the buried diffusion junctions are to be formed;
   (2) performing an oxidation process so as to transform each of the exposed portions of the pad oxide layer that are uncovered by the silicon nitride layer into a second oxide layer;
   (3) removing a second selected part of the silicon nitride layer to thereby expose part of the first oxide layer, with the remaining part of the silicon nitride layer covering the active regions;
   (4) performing an etching process with the silicon nitride layer serving as mask to thereby etch away the exposed portions of the first oxide layer;
   (5) forming a plurality of STI structures in the substrate to isolate the active regions from each other;
   (6) forming a doped area in the substrate beneath each of the second oxide layers; and
   (7) performing an annealing process to transform the doped area into the desired buried diffusion junction.

2. The method of claim 1, wherein in said step (2), the oxidation process is a wet oxidation process performed in a humid environment to allow the exposed portions of the first oxide layer to be thickened into the second oxide layer to a thickness of about 600 to 2,000 Å.

3. The method of claim 1, wherein in said step (4), the etching process comprises the step of using an etchants to perform a wet etching process.

4. The method of claim 3, wherein the etchants is a solution of HF.

5. The method of claim 1, wherein in said step (5), the STI structure is formed by the steps of:
   removing selected portions of the substrate that are uncovered by the silicon nitride layer to thereby form a plurality of trenches in the substrate;
   forming a third oxide layer over the exposed surfaces of the substrate in each of the trenches;
   filling up each trench with a dielectric material to an overflow level so as to form a dielectric layer in each trench;
   performing a densification process on the dielectric layer in each trench; and
   performing a CMP process so as to polish the overflow part of the dielectric layer in each trench.

6. The method of claim 5, wherein the third oxide layer is formed through a thermal oxidation process.

7. The method of claim 5, wherein the dielectric layer is a layer of TEOS.

8. The method of claim 7, wherein the TEOS layer is formed through a CVD process.

9. The method of claim 5, wherein the densification process is performed under a temperature of 900° C.~1,200° C.

10. The method of claim 1, wherein said step (6) further comprises, prior to the forming of the doped area, the steps of:

forming a plurality of sidewall spacers on the sidewalls of the openings in the silicon nitride layer; and performing an ion-implantation process so as to dope an impurity element into those areas in the substrate that are unmasked by both the sidewall spacers and the silicon nitride layer.

11. The method of claim 10, wherein the impurity element is arsenic.

12. The method of claim 1, further comprising, after said step (7), the steps of:

removing the silicon nitride layer; and removing the sidewall spacers.

13. The method of claim 12, wherein the silicon nitride layer is removed by using a solution of $H_3PO_4$.

14. A method for forming a plurality of buried diffusion junction in a semiconductor device, comprising the steps of:

(1) preparing a semiconductor substrate; then forming a first oxide layer over the substrate, forming a silicon nitride layer over the first oxide layer, and then removing a first selected part of the silicon nitride layer to thereby expose those areas of the pad oxide layer beneath which the buried diffusion junctions are to be formed;

(2) performing an oxidation process so as to transform each of the exposed portions of the pad oxide layer that are uncovered by the silicon nitride layer into a second oxide layer;

(3) removing a second selected part of the silicon nitride layer to thereby expose part of the first oxide layer, with the remaining part of the silicon nitride layer covering the active regions;

(4) performing an etching process with the silicon nitride layer serving as mask to etch away the exposed portions of the first oxide layer to thereby form a trench;

(5) forming a doped area in the substrate beneath each of the second oxide layers;

(6) forming a plurality of STI structures in the substrate to isolate the active regions from each other; and (7) performing an annealing process to transform the doped area into the desired buried diffusion junction.

15. The method of claim 14, wherein in said step (2), the oxidation process is a wet oxidation process performed in a humid environment to allow the exposed portions of the first oxide layer to be thickened into the second oxide layer to a thickness of about 600 to 1,000 Å.

16. The method of claim 14, wherein in said step (4), the etching process comprises the step of using an etchants to perform a wet etching process.

17. The method of claim 16, wherein the etchants is a solution of HF.

18. The method of claim 14, wherein said step (4) further comprises the substep of forming a third oxide layer in surfaces surrounding each trench.

19. The method of claim 18, wherein the third oxide layer is formed through a thermal oxidation process.

20. The method of claim 14, wherein said step (5) comprises the substeps of:

forming a first sidewall-spacer structure on the sidewalls of the silicon nitride layer and a second sidewall-spacer structure on the sidewalls of each trench; and performing an ion-implantation process with the silicon nitride layer and the first and second sidewall-spacer structures serving as a mask so as to dope an impurity element into unmasked portions of the substrate to thereby form the doped region, wherein the second sidewall-spacer structure prevents the impurity ions from penetrating into the sidewalls of the trench.

21. The method of claim 20, wherein the impurity element is arsenic.

22. The method of claim 14, further comprising, prior to said step (6), the step of removing the first and second sidewall-spacer structures.

23. The method of claim 22, wherein the first and second sidewall-spacer structures are removed by etching with a solution of HF.

24. The method of claim 14, wherein in said step (6), the STI structure is formed by the steps of:

filling up each trench with a dielectric material to an overflow level so as to form a dielectric layer in each trench;

performing a densification process on the dielectric layer in each trench; and performing a CMP process so as to polish the overflow part of the dielectric layer in each trench.

25. The method of claim 24, wherein the dielectric layer is a layer of TEOS.

26. The method of claim 25, wherein the TEOS layer is formed through a CVD process.

27. The method of claim 24, wherein the densification process is performed at a temperature of about 900° C.~1,200° C.

28. The method of claim 14, wherein the doped area is transformed into the buried diffusion junctions through an annealing process which is incorporated in the densification process.

* * * * *